United States Patent
Bogdanov (10) Patent No.: US 8,022,705 B2
(45) Date of Patent: Sep. 20, 2011

(54) MICROSTRIP COIL DESIGNS FOR MRI DEVICES

(75) Inventor: Gene Bogdanov, Manchester, CT (US)

(73) Assignee: Insight Neuroimaging Systems, LLC, Leominster, MA (US)

( * ) Notice: Subject to any disclaimer, the term of this patent is extended or adjusted under 35 U.S.C. 154(b) by 190 days.

(21) Appl. No.: 12/281,055

(22) PCT Filed: Mar. 7, 2007

(86) PCT No.: PCT/US2007/063442
§ 371 (c)(1),
(2), (4) Date: Nov. 25, 2008

(87) PCT Pub. No.: WO2007/103953
PCT Pub. Date: Sep. 13, 2007

(65) Prior Publication Data
US 2009/0099444 A1  Apr. 16, 2009

Related U.S. Application Data

(60) Provisional application No. 60/781,044, filed on Mar. 9, 2006.

(51) Int. Cl.
*G01V 3/00* (2006.01)
(52) U.S. Cl. ........................ 324/318; 324/322
(58) Field of Classification Search .......... 324/300–322; 600/407–455; 333/322, 224, 226, 232
See application file for complete search history.

(56) References Cited

U.S. PATENT DOCUMENTS

| 4,751,464 | A | 6/1988 | Bridges |
| 5,347,220 | A | 9/1994 | Heelsbergen |
| 6,029,082 | A | 2/2000 | Srinivasan et al. |
| 6,232,779 | B1 | 5/2001 | Tropp et al. |
| 6,304,156 | B1 * | 10/2001 | Ishizaki et al. ............. 333/134 |
| 6,711,430 | B1 | 3/2004 | Ferris et al. |
| 6,958,607 | B2 * | 10/2005 | Vaughan et al. ............ 324/318 |
| 7,202,668 | B2 * | 4/2007 | Ludwig et al. ............. 324/318 |
| 7,427,861 | B2 * | 9/2008 | Bogdanov et al. .......... 324/318 |
| 7,714,581 | B2 * | 5/2010 | Erickson et al. ............ 324/322 |
| 7,777,491 | B2 * | 8/2010 | Gao et al. .................. 324/318 |

(Continued)

FOREIGN PATENT DOCUMENTS
EP   0571211   11/1993

(Continued)

OTHER PUBLICATIONS

R. Srinivasan et al., Transmit/Receive Next Coil for 3T, Proc. Intl. Soc. Mag. Reson. Med. 10, 163, 2002.

(Continued)

*Primary Examiner* — Brij B Shrivastav
(74) *Attorney, Agent, or Firm* — Leason Ellis LLP (57) ABSTRACT

A microstrip-based RF coil for use in an MRI apparatus constructed to perform human head and extremity imaging according to one embodiment of the present invention includes a coil former defined by an inner core member and a shield support that surrounds the inner core member. An outer surface of the shield support supports a conductive segmented shield and a plurality of conductive strip lines are disposed on an inner surface of the inner core module and extend parallel to a longitudinal axis thereof. According to one aspect of the present invention, all of the strip lines are not homogenous so as to introduce asymmetry into the coil design.

30 Claims, 7 Drawing Sheets

U.S. PATENT DOCUMENTS

2010/0117642 A1* 5/2010 Zhai et al. .................. 324/307

FOREIGN PATENT DOCUMENTS

| WO | WO 02/32306 A2 | 4/2002 |
| WO | 2005/020793 A2 | 3/2005 |
| WO | WO 2005/020793 A2 | 3/2005 |

OTHER PUBLICATIONS

K. Vij et al., The Asymmetric Birdcage Design: A Quadrature Neck Coil Application, Book of Abstracts, vol. 2, Society of Magnetic Resonance in Medicine, p. 4010, 1992.

Adriany, G. et al., A geometrically adjustable 16 Channel Transceive Transmission Line Array for 7 Tesla, International Society for Magnetic Resonance in Medicine. Scientific Meeting and Exhibition. Proceedings, International Society for Magnetic Resonance in Medicine, US, vol. 13, Jan. 1, 2005, p. 673.

Adriany, G. et al., An Elliptical Open-Faced Transceive Array for Ultra High Field Parallel Imaging and fMRI Applications, International Society for Magnetic Resonance in Medicine. Scientific Meeting and Exhibition. Proceedings, International Society for Magnetic Resonance in Medicine, US, vol. 11, Jan. 1, 2004, p. 1604.

Vaughan J. et al., The Head Cradle: An Open Faced, high Performance TEM Coil, International Society for Magnetic Resonance in Medicine. Scientific Meeting and Exhibition Proceedings, International Society for Magnetic Resonance in Medicine, US, vol. 9, Jan. 1, 2001, p. 15.

International Search Report and Written Opinion from the corresponding PCT Application No. PCT/US07/63442 dated Mar. 19, 2008.

* cited by examiner

MICROSTRIP COIL DESIGNS FOR MRI DEVICES

TECHNICAL FIELD

The present invention relates to MRI equipment and more particularly, to a microstrip-based RF coil for use in head and extremity imaging applications and has an asymmetrical coil design, as well as having a completely unobstructed openings that are formed in the coil to ergonomically accommodate the patients body and to reduce or eliminate the claustrophobic feeling that is often experienced by a patient when inside the coil, particularly if it is over the head.

BACKGROUND

There are a number of different MRI equipment designs commercially available and depending upon the precise application, these designs will differ substantially in their structures, as well as function in different ways.

For example, the present assignee has developed a number of different methods and apparatuses for performing magnetic resonance imaging (MRI) both in animals and humans. Assignee's International Patent Application Serial No. PCT/US2004/027532, filed Aug. 23, 2004, which is hereby incorporated by reference in its entirety, discloses a microstrip-based RF coil for use in an MRI apparatus constructed to perform human head imaging. The microstrip coil includes a cylindrical non-magnetic core module having an outer surface and a longitudinal axis, a cylindrical bore extending through the core module along the longitudinal axis and defining an inner surface; and a plurality of conductive strip lines. The strip lines extend parallel to the longitudinal axis on the outer surface of the core module. The coil also includes a pair of circuit boards carried at or near the ends of the core module. The coil is constructed such that one or more of the conductive strips are divided into conductive microstrip segments, with one or more tuning capacitors being bridged between two adjacent microstrip segmented sections of the conductive strip. The coil also includes a shield support cylinder that is disposed concentrically about the core module and is spaced therefrom to receive the tuning capacitors. The shield support cylinder supports a conductive segmented shield that is operatively connected to the conductive strips through tunable capacitors at a front and rear of the shield support cylinder.

Although MRI scans are ideal for diagnosing and evaluating a number of conditions, it does have a number of drawbacks and in particular, being subjected to an MRI scan can be a very uncomfortable and frightening experience for some. More specifically, one of the chief complaints about the MRI experience is that there are many claustrophobic people in the world and being in an MRI machine can be a very disconcerting experience for these type of people. Even people that are not normally claustrophobic can feel uncomfortable in the MRI equipment since the patient must enter into the tubular MRI device which can lead to a feeling of being in a dark tunnel. In addition, an MRI device makes a tremendous amount of noise during the scan. The noise sounds like a continual, rapid hammering and while patients can use earplugs or stereo equipment to muffle the noise, the noise in combination with the darkness and the closeness of the inner surface of the device to the face and body makes it a potentially stressful environment. The noise is due to the rising electrical current in the wires of the gradient magnets being opposed by the main magnetic field. Moreover, MRI scans require patients to hold very still for an extended period of time. MRI exams can range in length from 20 minutes or less or can be upward of 90 minutes or more. Even slight movement of the patient being scanned can cause very distorted images that will have to be repeated. The above characteristics of the MRI experience make it difficult for some patients and one of the biggest factor that patients mention when describing the MRI experience is that they feel uneasy and uncomfortable when their head is contained within a dark tubular structure and they are unable to see outside of the MRI device.

Performance of the MRI coil also suffers when the size of the coil does not conform well to the patients body. A coil design that is more ergonomic in nature will put the coil elements closer to the patient without closing in the patient. The closer the coil elements are to the patient, the more sensitive they are and the more signal they collect, resulting in shorter signal collection times. This reduces the patients time inside the MRI apparatus.

SUMMARY

A microstrip-based RF coil for use in an MRI apparatus constructed to perform human head and extremity imaging according to one embodiment of the present invention includes a coil former defined by an inner core member and a shield support that surrounds the inner core member. An outer surface of the shield support supports a conductive segmented shield and a plurality of conductive strip lines are disposed on an inner surface of the inner core module and extend parallel to a longitudinal axis thereof, with the strip lines being electrically connected to the segmented shield. According to one aspect of the present invention, the strip lines are not all uniform so as to introduce asymmetry into the coil design.

According to another aspect of the present invention, a head coil is provided and includes a modified electrical structure to permit the incorporation of a completely unobstructed opening at one of the coil design to permit the patient to look outside of and beyond the coil when the patient's head is positioned in the coil. The opening is formed by cutting or removing a section of the coil structure at the lower end and therefore the opening is intended for positioning in front of the eyes when the patient's head is inserted into the coil.

Another aspect of this present invention allows the coil to surround the ankle region while an opening on the end of the coil allows passage of the foot through the coil at a perpendicular angle to the coil axis. This is achieved in the exact same manner as the previous example with the head coil.

Another aspect of this present invention allows the placement of the coil over the shoulder region. The cut out, in a similar manner as the 2 previous aspects, allows the coil to better conform to the patient should area by allowing the coil to extend passed the torso of the patient.

Another aspect of this present invention allows the placement of the coil over the hip region. The cut out, similar to the last 3 aspects, allows the coil to be placed high up on the leg with the outer sides extending over the hip region for better sensitivity in that area.

Another aspect of this present invention allows the coil to surround the lower neck region. Two cut out sections are present in this design on opposite sides of the coil body. These openings allow placement of the coil over the shoulders of the patient.

The electrical structure of the exemplary coils according to the present invention includes a plurality of microstrips that are disposed on an inner surface of an inner core module and a shield that is supported by an outer surface of an outer shield support member that surrounds the inner core module. In order to incorporate and form the opening, a number of microstrips are shortened relative to the others and similarly, a number of shield segments are shortened relative to the other shield segments. The shortened microstrips are still electrically connected to the shield with tuning capacitors.

By incorporating an opening into the coil design, the claustrophobic feeling that many patients experience when undergoing an MRI scan is substantially reduced or eliminated entirely. In head imaging applications this is accomplished since the patient can look through the opening and thus does not feel as contained or trapped within the head coil. In extremity imaging applications the free passage of the body parts allows for greater patient comfort without sacrificing sensitivity.

The addition of the opening to the various coil designs according to the present invention introduces strong asymmetry into the electrical coil structure and therefore, results in the following complications. First, the conventional theory of the symmetrical volume coil no longer applies and thus, the resonant modes no longer produce sinusoidal current distributions around the coil circumference. Similarly, the conventional tuning method that sets all capacitors to the same value can no longer be used. Second, assuming in the case of head imaging applications, the opening is positioned in front of the eyes of the patient, the coil should be symmetric around the mid-sagittal plane in order to achieve isolation between the RF ports. These complications were overcome by the coil design of the present invention which has an asymmetrical design in complete contrast to the conventional teachings of coil design.

According to another embodiment, a hybrid type coil has a TEM-like termination to a shield at one end and a low-pass birdcage end ring disposed at the other end with capacitors between the microstrips and the end ring. This is in contrast to a conventional low-pass birdcage coil design that includes two end rings one at each end of the microstrips with capacitors between the ends of the microstrips and the respective end rings. The hybrid design can include the opening and in which case, it will have an asymmetrical design; however, the hybrid coil does not necessarily have to incorporate the opening.

BRIEF DESCRIPTION OF THE DRAWING FIGURES

FIG. 2b is a perspective view of an upper side of the microstrip coil of FIG. 2a;

FIG. 3b is a perspective view of an upper side of the microstrip coil of FIG. 3a;

FIG. 4b is a perspective view of an upper side of the microstrip coil of FIG. 4a;

DETAILED DESCRIPTION OF PREFERRED EMBODIMENTS

As previously mentioned, the present application is an extension of the Applicants' RF microstrip coil technology as applied to the magnetic resonance imaging of both animals and humans, as disclosed in PCT application No. PCT/US01/32586; U.S. Pat. No. 6,711,430, and PCT application No. PCT/US2004/027532, each of which is incorporated by reference in its entirety.

Figure 1:
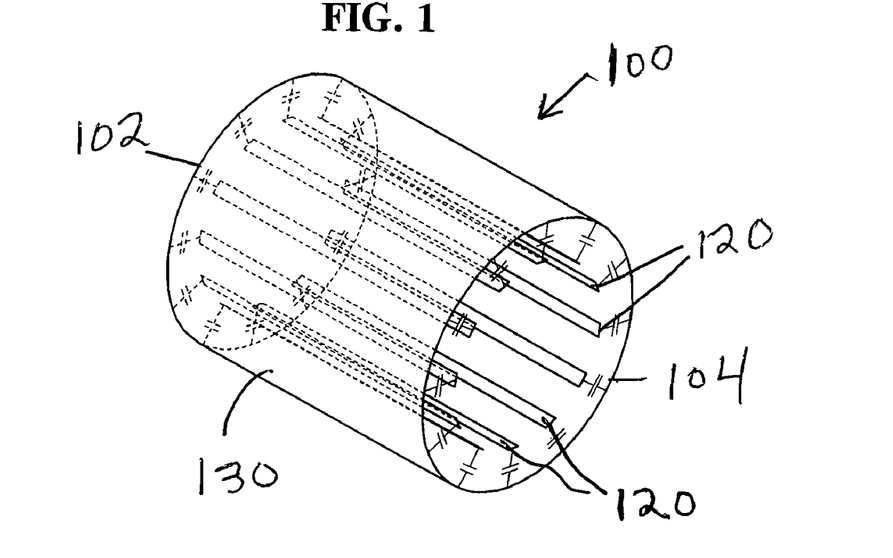
FIG. 1 is a perspective view of an RF structure of a basic microstrip volume coil.

Referring to FIG. 1, an RF structure of a microstrip volume coil 100 that is suitable for magnetic resonance imaging of humans and is similar to the microstrip design disclosed in the '532 PCT application.

According to one exemplary embodiment, the volume coil 100 has a first end 102 and a second end 104 and includes an inner cylinder (core module), as well as an outer cylinder (outer shield support) (not shown). The core module is preferably formed as a cylindrical non-metal element that has an inner surface and an opposing outer surface, as well as a first end and an opposing second end. The core module thus is a hollow open ended structure with a central bore extending therethrough which receives the patient's head during anatomical or neuroimaging applications. Similarly, the outer cylinder (shield support) is preferably formed as a cylindrical non-metal element that has an inner surface and an opposing outer surface and is disposed concentric with and radially outward from the inner cylinder. Often, the combination of the inner cylinder and the outer cylinder spaced therefrom is referred to as a "coil former" (e.g., an acrylic coil former). In order to show the electrical structure of the coil 100, the inner cylinder and the outer cylinder are not explicitly shown in FIG. 1 to more easily illustrate the relationship of the electrical structure.

The inner cylinder and outer cylinder are typically coupled or attached near their first ends 102 to a front end plate and is likewise coupled or attached near or at their second ends 104 to a second end plate. The end plates thus connect the two tubular structures, namely, the inner and outer cylinders at their ends.

It will be appreciated that each of the front and rear end plates are in the form of ring-shaped members (annular structures). The front end plate is often spaced from the first end 102, while the rear end plate is typically provided closer to or at the second end 104; however, the precise locations of the end plates is not of the utmost criticality.

In accordance with the present invention, the inner cylinder has associated therewith a plurality of microstrips 120 that are disposed and coupled to the inner cylinder along the inner surface thereof or alternatively, as disclosed in the '532 PCT application, the microstrips 120 can be formed on the outer surface thereof, which is in contrast to their conventional placement on the inner surface. As with the previous design, the microstrips 120 can be formed of a number of different conductive materials and can come in different dimensions. In one embodiment, the microstrips 120 are in the form of thin layers of metal film or foil that are attached to the inner surface of the inner cylinder in a predetermined pattern using conventional means, such as an adhesive agent or even a mechanical connection.

Due to its resemblance to a birdcage structure, this type of volume coil 100 is often referred to as being a "birdcage coil".

In this conventional design, the microstrips 120 are in the form of continuous strips of material that extend parallel to a longitudinal axis of the inner cylinder.

The microstrips 120 can be simple flat (cylinder conforming) copper strip conductors, such as copper foil strip line elements.

When the microstrips 120 are provided on the inner surface, the outer surface of the outer cylinder can support shielding 130. In other words, the shielding 130 is provided on an outer surface of a cylindrical support member (outer cylinder) that is concentric with the inner cylinder and is radially offset therefrom. The shielding 130 is formed in strips to reduce the occurrence of eddy currents induced by gradient coils. The shielding 130 in strips can form a plurality of coaxial slots along the coil's length which serve to interrupt switched gradient induced eddy propagation.

The volume coil 100 has a number of capacitors and in particular, a number of tuning capacitors are provided for electrically connecting the microstrips 120 to the shielding 130. For example, tuning capacitors can be formed between the longitudinal strips of the microstrips 120, as well as being spaced between the longitudinal strips of the shielding 130.

When the volume coil is in the form of a low-pass birdcage coil, a first conductive ring can be provided on the inner surface of the inner cylinder and in particular, the microstrips 120 are terminated through tuning capacitors to a first conductive ring that is formed at the first end 102 of the inner cylinder and can represent the innermost element of the coil 100. The first conductive ring is not electrically connected to the shielding 130. Similarly, the opposite ends of the microstrips 120 are terminated through tuning capacitors to a second conductive ring that is formed at the second end 104. Once again, the second conductive ring is not electrically connected to the shielding 130.

While the relative dimensions of the conductive shielding 130 and the underlying microstrips 120 are not critical and the dimensions of each will vary depending upon the precise application, one microstrip 120 typically will have a width less than the width of one conductive shielding strip 130 such that one or more microstrips 120 can underlie one conductive shielding strip 130. The strip width is carefully optimized using numerical simulation tools for optimal field homogeneity and RF efficiency.

While the inner core module, as well as the shield support cylinder, is described as having a cylindrical shape; it will be appreciated that this shape is merely exemplary in nature and not limiting since these members can be made in other shapes.

Other details concerning how the volume coil 100 operates and how it is constructed are found in the previously discussed and expressly incorporated PCT patent application No. PCT/US2004/027532. For example, the coil 100 further includes a front printed circuit board (PCB) and a rear printed circuit board that are mounted to and supported by a front end plate and a rear end plate that serve as support structures for the volume coil 100. These two circuit boards support tune and match circuits as described in the '430 patent and the above '532 PCT application. The components that form a part of the PCBs, their operation, as well as general schematics of circuitry are disclosed in the previously incorporated '430 patent and the above applications. For example, the volume coil 100 has a plurality of resonating elements which include the microstrips 120 and the shielding 130. The resonating elements are connected to detuning/tuning circuits in order to move the resonance frequency of the resonating elements away from the target resonance so as not to interfere with the receiving coil as explained in '430 patent. The volume coil 100 in addition has a matching circuit for adjusting the impedance of the resonating element to that of the RF source. The volume coil 100 has a transceiver unit and a detuning source associated with its circuitry. The RF source, the transceiver unit and the detuning source; however, can not part of and can be located remote from the volume coil and are connected through coaxial cables which extend out thereof and connect to the transceiver unit. The volume coil 100 has an RF decoupling circuit that ensures that the DC detuning signal does not interfere with the RF signal path.

In addition and as explained in the '430 patent and the other applications, the circuitry that can be associated with the volume coil 100 that is located on the volume coil can include a matching circuit includes a variable tunable capacitor. The detuning source is connected to the detuning circuit via a filter circuit and the RF decoupling circuit. The filter circuit has inductors and a capacitor. The filter can be for separating the high frequency RF from interfering with the tuning/detuning signal. The RF decoupling circuit has three radio-frequency chokes (RFC) which represent low resistance to the DC current, but high impedance to the RF signal, thereby decoupling both signals from each other. From the detuning circuit which contains a pair of pin diodes, the resonating element is connected.

As described below in more detail, the volume coil 100 can have several inputs including the RF source from the RF transmitter of the transceiver unit, the DC source and a ground. The microstrips 120 are each part of a resonating element and can be represented in the circuit as a distributed inductor in the resonating element. The microstrips 120, as represented by the inductors, can be connected in series to a pair of capacitors, with one of the capacitors being a variable, tuneable capacitor. The variable, tuneable capacitors can be tuned manually or electronically and they are each carried on one printed circuit board.

The above discussion of the PCBs is merely illustrative of one embodiment and sets forth the general details of the PCBs and therefore, does not limit the present invention but merely is illustrative. For a more detailed analysis of the PCBs, the reader should consult the '430 patent that gives the general framework.

In the illustrated embodiment, the apparatus 100 includes one or more RF connectors and more precisely, can include a first RF connector and a second RF connector that are orientated at a predetermined angle, such as 90 degrees, apart from one another and are mounted on the front cover plate. The front cover plate also typically includes an active detuning connector as well as a plurality of openings formed circumferentially around a perimeter edge thereof. These openings serve as tuning rod sockets to permit a tuning rod to enter and access electronic components covered by the front cover plate. More specifically, the openings permit manual adjustment of the variable capacitors associated with each microstrip 120. The access ports can be closed during normal operation. Other openings can optionally receive plastic support rods that support the entire apparatus 100 and permit the apparatus 100 to be slidingly moved thereover. All of the coils disclosed herein can contain this feature to permit the sliding movement of the coil relative to a frame structure.

It will also be appreciated that the above described volume coil 100 is incorporated into an MRI system that has other traditional control and operating components, such as those described in the '430 patent and other applications, and therefore, these components are not disclosed herein. Since the present invention is directed to the construction of the volume coil (microstrip-based RF coil), the present discussion focuses on this construction and details of complementary components are not included herein.

Figure 2A:
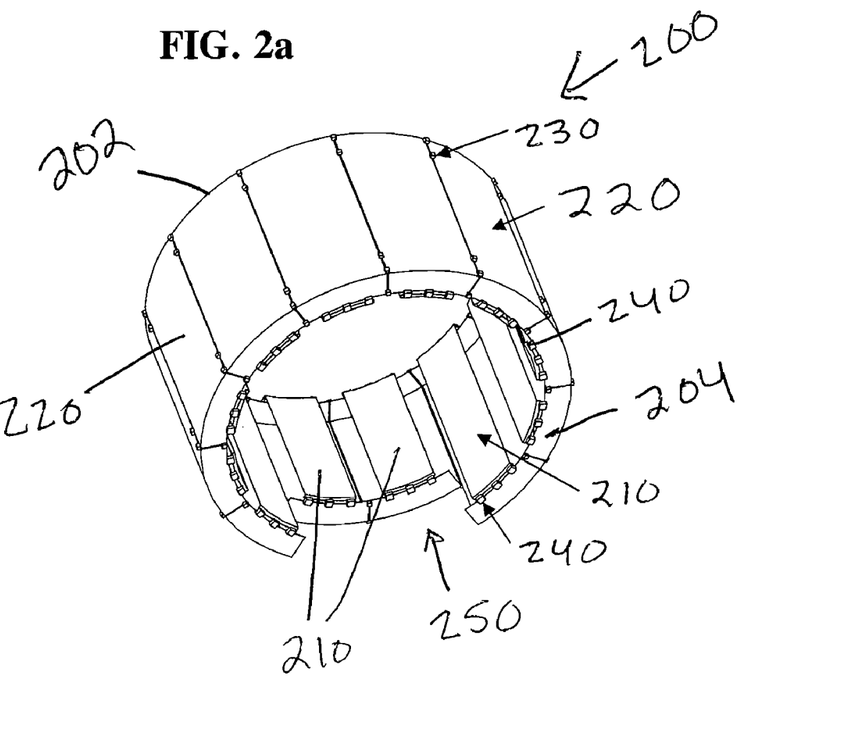
FIG. 2a is a perspective view of a lower side of a microstrip coil with an opening according to one exemplary embodiment.
Figure 2B:
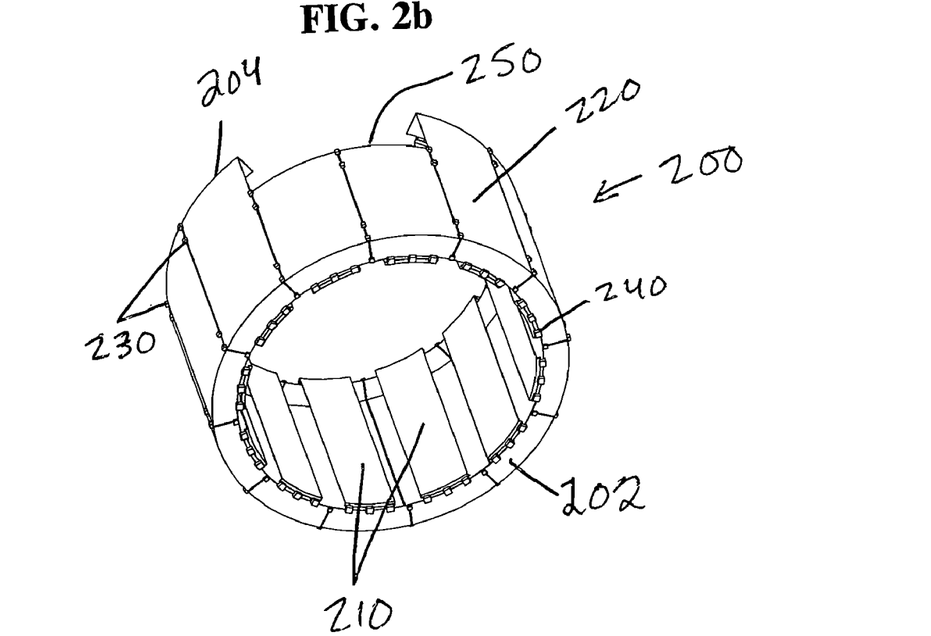

Now referring to FIGS. 2a and 2b, a microstrip volume coil 200 according to one embodiment of the present invention is illustrated. The microstrip volume coil 200 has a number of features that are in common with the microstrip volume coil 100, such as the electronic components and the coil former design, and therefore, it will be understood that the above described features described with reference to the volume coil 100 can be incorporated in the volume coil 200.

FIG. 2a shows a lower side of the electrical structure of the microstrip coil 200 with an opening feature 250 formed as a part thereof. The microstrip coil 200 has a first end 202 and an opposing second end 204 and includes an inner cylinder (inner core module) and an outer cylinder (shield support) (coil former) which is disposed radially outward from the inner cylinder and preferably concentric thereto. These elements have not been shown to improve clarity of the other elements including the electrical components. The inner cylinder includes an inner surface and an outer surface and typically, the inner cylinder is in the form of a cylindrical member, with cylindrically shaped inner and outer surfaces. Similarly, the outer cylinder includes an outer surface and includes cylindrically shaped inner and outer surfaces.

In this embodiment, the microstrip coil 200 is open at both the first end 202 and the second end 204.

The inner surface of the inner cylinder includes microstrips 210 that are similar to the same as the previously described microstrips 120 in that they are in the form of elongate conductive strips (e.g., metal strips) that are positioned circumferentially about the inner surface of the inner cylinder (inner core module). As previously mentioned, the microstrips 120 are segmented as opposed to being a completely cylindrically shaped single shield.

As a result of having the opening feature 250 incorporated into the design of the microstrip coil 200, the microstrip design is not homogenous in that the lengths of the microstrips 210 are not the same about the circumference of the inner cylinder. More specifically, at least one and preferably a plurality of microstrips 210 have a reduced length compared to the rest of the microstrips 210. The reduced length microstrips 210 coincide with the location of the opening feature 250 as illustrated in the figures and described below.

The opening feature 250 is in the form of a window at one end, e.g., the second end 204, that is intended to be aligned with the user's eyes (face) or other body part, so as to greatly reduce or eliminate the claustrophobic feeling that many patient's experience when they are required to be disposed in the microstrip coil 200. In other words, the opening feature 250 is configured so that when the patient is in the scanning position, the opening feature 250 is aligned with the face and eyes of the patient. The opening feature 250 is thus in the form of a cutout in the cylindrical shape of the microstrip coil 200 where a section (arcuate section of predetermined width) is removed from the microstrip coil 200. This opening can also be aligned with the patients foot in the application of ankle imaging, shoulder in the application of arm imaging. Two openings can be aligned with the shoulders in the case of neck imaging.

In the illustrated embodiment, there are two microstrips 210 formed on the inner surface of the inner cylinder that are of a reduced length compared to the lengths of the other microstrips 210.

In addition, the microstrip coil 200 includes a shielding 220 that is similar to the shielding 130 described above. As with the previous design, the shielding 220 is in the form of segmented shielding sections or strips 220 that are disposed circumferentially about the outer surface of the outer cylinder component of the coil former.

As with the segmented microstrips 210, there are gaps between the shielding segments 220 that are formed adjacent to one another. The ends of the shielding 220 can be bent or angled at the first end 202 and the opposite second end 204. For example, the ends of the shielding 220 can be bent at about a 90 degree angle (right angle) at each end 202, 204.

Similarly and as a result of having the opening feature 250 incorporated into the design of the microstrip coil 200, the shield design is not homogenous in that the lengths of the shielding strips or segments 210 are not the same about the circumference of the coil former. More specifically, at least one and preferably a plurality of shielding strips 220 have a reduced length compared to the rest of the shielding strips 220. The reduced length shielding strips 220 coincide with the location of the opening feature 250 as illustrated in the figures and described below. Thus, the reduced length shielding strips 220 overlap the reduced length microstrips 210 so as to form the opening 250.

As with the volume coil 100, the microstrip coil 200 has a number of capacitors and in particular, a number of tuning capacitors are provided for electrically connecting the microstrips 210 to the shielding 220 (segmented shield). For example, tuning capacitors can be formed between the longitudinal strips of the microstrips 210, as well as being spaced between the longitudinal strips of the shielding 220. More specifically, the plurality of shield interconnection capacitors 230 is provided between the shielding strips 220 and each end 202, 204 of the shielding 220 can include a number of resonator capacitors 240 that are connected to the interconnection capacitors 230 and are typically in the form of a ring of capacitors that extend around the circumference of the coil 200 at each end 202, 204. It will be appreciated that the opening 250 results in a set of resonator capacitors 230 being axially offset from the other resonator capacitors 230 since the resonator capacitors 230 that are associated with the opening 250 lie in a plane that is offset from the plane that contains the other resonator capacitors 230. The bent ends of the shielding strips 220 that correspond to the opening 250 are thus recessed relative to the other bent ends of the shielding strips 220.

As with the volume coil 100, the volume coil 200 includes other conventional electronics and control systems, such as the first and second circuit boards, etc. As disclosed in the '532 PCT patent application, the coils of the present invention, including the coil 200, feature microstrips that are optimized in terms of their respective widths. By optimizing strip width, the fewer strips can be used to achieve the same transversal field homogeneity as in competing designs. In one embodiment, the resulting wide strips, which occupy greater than 50% of the available surface area, and the overall reduction in the number of strips both benefit the signal-to-noise ratio, which is itself optimized.

The opening feature 250 of the volume coil 200 offers a completely unobstructed opening which is added by "cutting out" a portion of the coil structure at the lower end (second end 204) which corresponds to a location in front of the eyes, or at other body parts for extremity imaging. Thus, several of the microstrips 210 are shortened and a rectangular portion of the shield 220 is removed. The shortened microstrips 210 are still connected to the shield 220 by means of the tuning capacitors.

It will therefore be understood that standard microstrip coil designs are symmetric with respect to their two quadratically opposed channels. This results in a symmetric field distribution which can be simulated using a standard analytic channels. Incorporating the opening feature 250 of the microstrip coil 200 results in an asymmetric field distribution that requires a specialized finite element method. The shorter microstrips 210 of the cutout region (opening 250) require their own relationship within the defining model in order to derive the terminating capacitance values needed for a given resonant frequency. In implementing the opening 250 into the coil 200, several changes, as mentioned above, are required and in particular, the end printed circuit board (PCB) is designed in multiple sections in order to accommodate the indented cutout section (opening 250). In addition, the mechanical components that make the former (acrylic member) that the coil is built onto have been modified to accommodate the indentation of the opening (250). This results in the asymmetric microstrip coil design which is contrast to conventional MRI microstrip design practices.

Figure 3A:
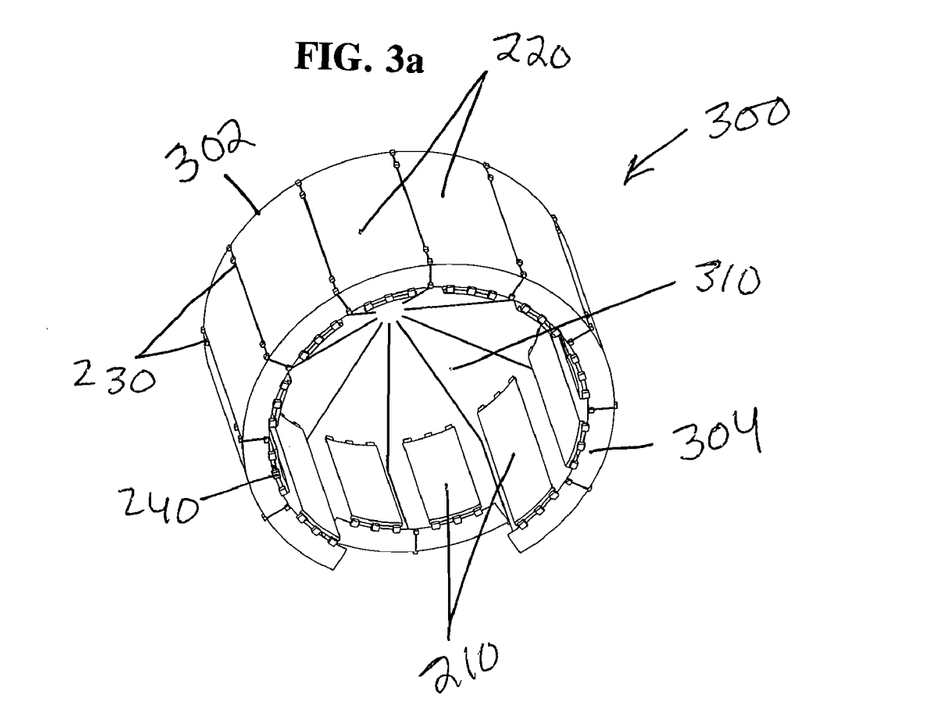
FIG. 3a is a perspective view of a lower side of a microstrip coil with an opening and end cap according to another exemplary embodiment.
Figure 3B:
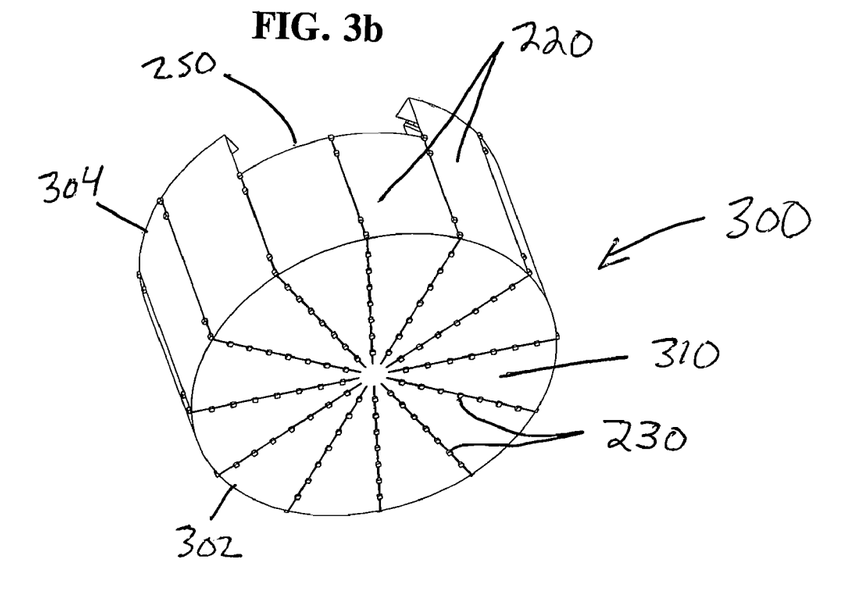

Now referring to FIGS. 3a and 3b a microstrip coil 300 is illustrated, with FIG. 3a being a lower side and FIG. 3b shows the upper side of the coil 300. The coil 300 is similar to the coil 200 in that the coil 300 includes microstrips 210 formed on the inner cylindrical surface of the inner cylinder (inner core module) and segmented shield 220 is provided and disposed concentrically and radially outwardly from the microstrips 210 on the outer cylinder (shield support). The primary difference between the coil 100 and the coil 300 is that one end of the coil 300 includes an end cap structure and more specifically, a first end 302 that represents an upper side of the coil 300 is closed with and end cap 310, while an opposite second end 304 (lower side) is open and, as in the coil 200, includes the opening 250.

In this embodiment, the shield end cap 310 is in the form of a flat (slotted) circular conductive element that connects to the shield 220 and closes of the upper end (first end 302) of the coil 300 electronically. The microstrips 210 are then terminated to the end cap through tuning capacitors as shown. In addition, as best shown in FIG. 3b, the shield capacitors 230 extend not only along and between the segmented shield elements 220 but also they extend along the shield end cap 310 since the shield end cap 310 is slotted (segmented) just like the shield segments 220. The lines of tuning capacitors on the end cap 310 thus appear as spokes of the circular end cap 310 and the generally converge at the center of the end cap 310 and in particular can terminate proximate a small central opening (circular) formed in the end cap 310.

The other electronic components that are used with the coil 300 are similar or identical to the ones previously disclosed and those that are described in the applications and patents expressly incorporated herein.

Figure 4A:
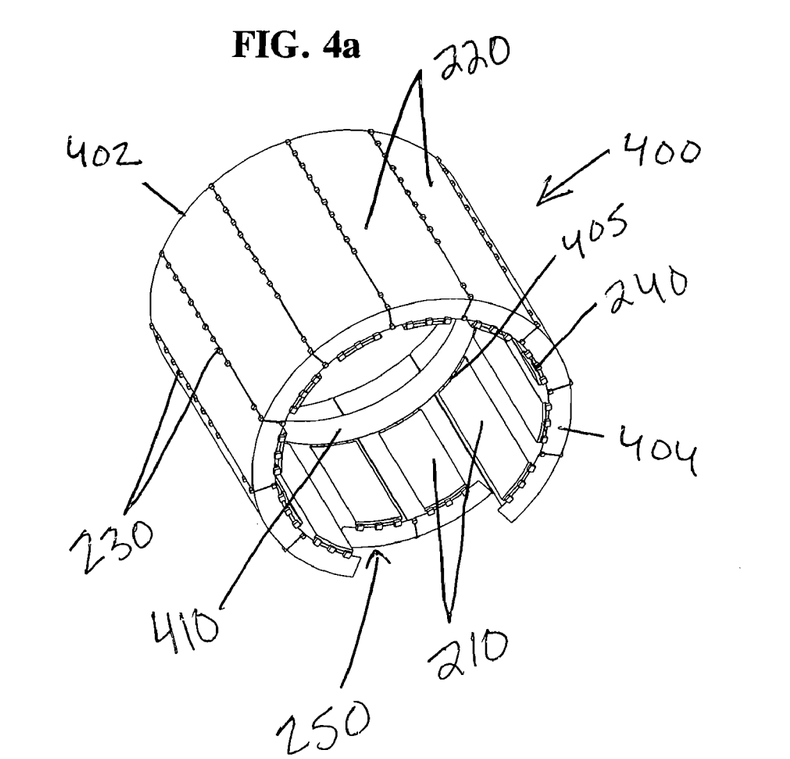
FIG. 4a is a perspective view of a lower side of a hybrid coil according to one exemplary embodiment of the present invention.
Figure 4B:
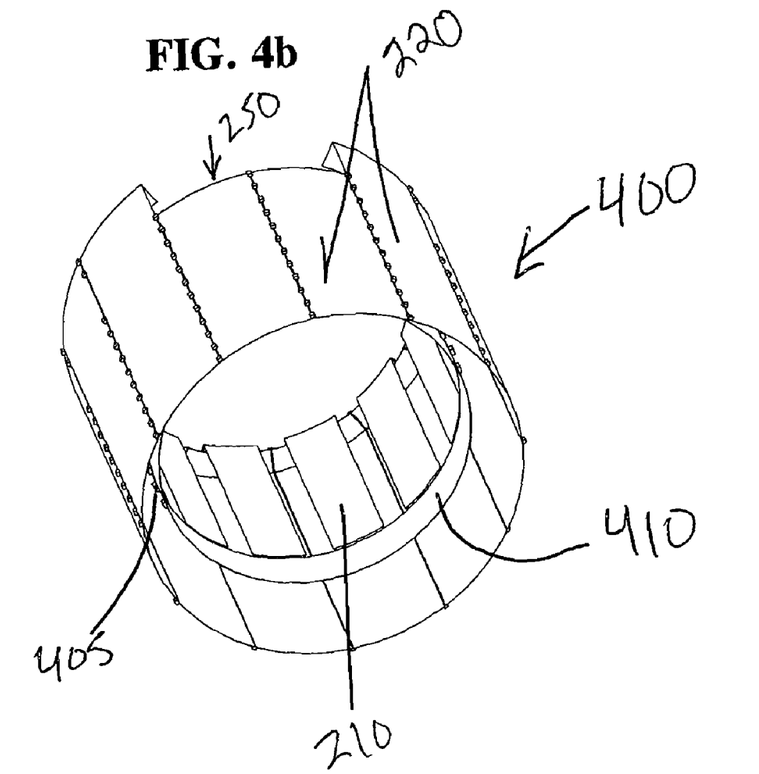

Now referring to FIGS. 4a and 4b, a hybrid coil 400 according to another embodiment is illustrated, with FIG. 4a being a lower side view and FIG. 4b being an upper side view. The coil 400 is similar to the other coils, such as coils 200 and 300, and therefore like elements are numbered alike. The coil 400 has a first end 402 and an opposing second end 404 and includes the coil former formed of the inner cylinder and outer cylinder (inner core module/shield support), each of which has an inner surface and an outer surface, with the inner surface of the inner cylinder supporting the microstrips 210 and the outer surface of the outer cylinder supporting the shielding 220. As in the other embodiments, the microstrips 210 are segmented into a plurality of elongated microstrips 210 that are disposed circumferentially about the inner surface, while the shielding 220 is in the form of a plurality of shield strips 220 that are arranged circumferentially about the outer surface and concentric with microstrips 210.

The coil 400 bears some resemblance to a conventional "birdcage" type coil since the microstrips 210 are terminated through tuning capacitors 405 to a conductive ring 410 which it not electrically connected to the shield 220. More specifically, the conductive ring 410 is disposed near or at the first end 402; however and unlike a conventional low-pass birdcage coil design, there is no second conductive ring near or at the second end 404. In the illustrated embodiment, the conductive ring 410 is spaced from the first end 402 that is defined by one end of the shield segments 220. In other words, the respective ends of the microstrips 210 that face the first end 402 do not extend to the respective ends of the overlying shielding 220 but rather terminate prior thereto and in particular, a sufficient distance is formed between the ends of the microstrips 210 and the ends of the shielding 220 for the conductive ring 410 to be received therein. It is at the ends of the microstrips 210 that the capacitors 405 are provided and act to electrically connect the microstrips 210 to the conductive ring 410. However, since there is a coil former (inner and outer cylinders) between the microstrips 210 and the shielding 220, the conductive ring 410 is likewise separated and insulated from the shielding 220 and is therefore not electrically connected thereto.

In contrast to the conventional design for a low-pass birdcage type coil, the coil 400 does not include two conductive rings at either end of the coil. In this conventional birdcage design, the two conductive rings are electrically connected to the tuning capacitors at the ends of the microstrips. In other words, the microstrips are terminated at each end through tuning capacitors to respective conductive rings, with each conductive ring not being electrically connected to the shielding.

It will be appreciated that the microstrips 210 of coil 400, as in the other embodiments, have two different lengths or sizes, with the microstrips 210 that are associated with the opening 250 being shorter than the other microstrips 210 that are associated with the sections outside of the opening 250.

Once again and as with the previous embodiment, the electronics, operating system and additional operative components for the coil 400 are disclosed with reference to the expressly incorporated patents and patent applications.

It will also be appreciated that while the described and illustrated hybrid coil 400 includes the opening 250, the hybrid coil 400 does not necessarily have to include the opening 250 but rather can simply be a hybrid coil with a TEM-like termination (transversal electromagnetic (TEM) resonator structure) to the shield at one end and a low-pass birdcage end ring at the other end, with capacitors between the microstrips and the end ring. The birdcage end is open to receive the head, while the TEM end is end capped in order to allow for a shorter fall off of the field and an improved Z axis.

Figure 5A:
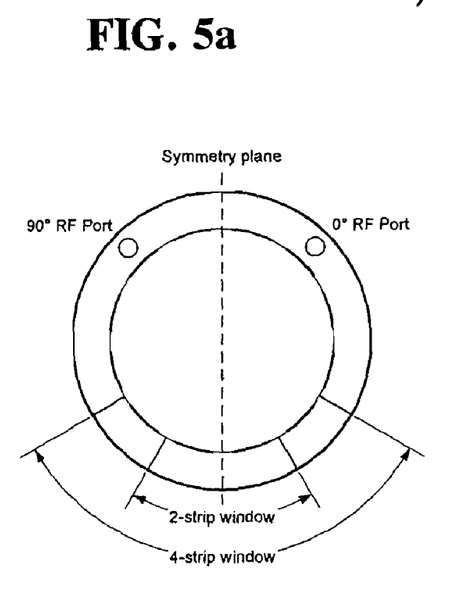
FIG. 5a is a schematic view of a opening and RF port placement that preserve coil symmetry around a mid-sagittal plane for a coil having twelve strips.
Figure 5B:
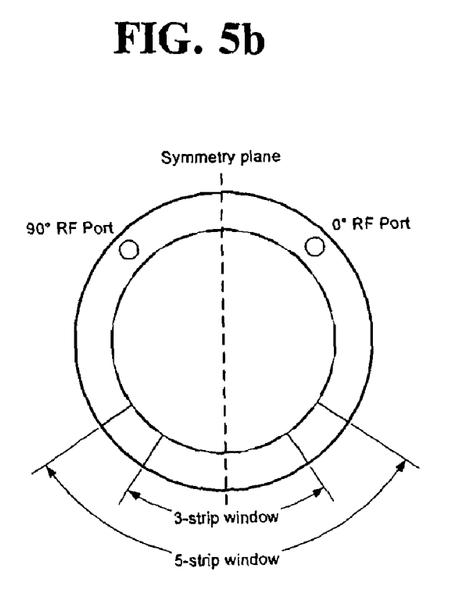
FIG. 5b is a schematic view of a opening and RF port placement that preserve coil symmetry around a mid-sagittal plane for a coil having sixteen strips.

The addition of the opening 250 to each of the coils 200, 300, 400 according to the present invention introduces strong asymmetry into the electrical coil structure and therefore, results in the following complications. First, the conventional theory of the symmetrical volume coil no longer applies and thus, the resonant modes no longer produce sinusoidal current distributions around the coil circumference. Similarly, the conventional tuning method that sets all capacitors to the same value can no longer be used. Second, assuming in the case of head imaging, that the opening 250 is positioned in front of the eyes of the patient, the coil 200 should be symmetric around the mid-sagittal plane in order to achieve isolation between the RF ports. The two quadrature RF ports should be positioned 90 degrees to each other, symmetrically to the mid-sagittal plane. As a result, a 12 strip implementation can use an even number of microstrips 210 for the opening 250 as shown in FIG. 5a. In general, if the number (#) of microstrips divided by 4 is an odd number, then an even number of microstrips 210 can be used for the opening 250 (FIG. 5a). Conversely, the 16 strip implementation can use an odd number of strips for the opening 250 as shown in FIG. 5b. In general, if the number (#) of microstrips divided by 4 is an even number, then an odd number of microstrips 210 can be used for the opening (FIG. 5b).

The end-capped microstrip coil 300 of FIGS. 3a and 3b is expected to achieve the highest signal-to-noise ratio as well as the best z-axis field homogeneity of the three coil designs. This is because the end-cap removes the field drop-off at the upper end (improving the z-axis field homogeneity), as well as increases the filling factor and reduces radiation losses. However, this configuration is easily perturbed by the load due to the high filling factor and relatively low coupling between the strips. The transversal field homogeneity, affected by the load, can be restored by the fine-tuning individual microstrip terminating capacitors.

The hybrid configuration of the coil 400 of FIGS. 4a and 4b reduces the load dependence of the field homogeneity, while preserving the unobstructed view that is provided by the opening 250. The reduced load dependence is due to the end ring 410, while eliminates the lowest order (order-0) parasitic resonant mode of the microstrip coil as well as increases the beneficial coupling between the microstrips. The RF port attachment in this embodiment/configuration is complicated by the need for good balanced-to-unbalanced transformers if connections are made at the end-ring capacitors.

Table 1 details the dimensions and parameters of one possible embodiment of the microstrip coil opening. For this embodiment, the structure of FIGS. 2a and 2b is supported by the coil former, defined by the inner core module (e.g., an acrylic structure) and the outer shield cylinder (e.g., an acrylic structure), and thus is built from two tubular members and endplates that connect the tubular members at their ends. In this embodiment, the shielding is in the form of a copper shield 220 adhesively installed on the outer cylindrical surface of the assembled former, while the microstrips 210 are installed on the inner cylindrical surface. Printed circuit boards are installed at the endplates and the coil includes housing tuning capacitors that make the connections between the microstrips 210 and the shield 220, as well as the matching circuits and cable connectors for the RF ports. This construction method is similar to the method employed with the previous microstrips for animal applications.

TABLE 1

Dimensions and parameters of one exemplary microstrip coil with opening according to the present invention:

| Inner cylinder: | |
| --- | --- |
| Outer diameter | 10.5 in |
| Inner diameter (location of microstrips) | 10.25 in |
| Material | acrylic |
| Outer cylinder | |
| Outer diameter (location of shield) | 12.5 in |
| Inner diameter | 12.25 in |
| Material | acrylic |
| Cutout (opening) | |
| Depth | 2 in |
| Span angle | 60 degrees |
| Coil length | 7 in |
| Number of strips | 12 |
| Strip width (optimized) | 1.86 in |

Example 1

Finite element simulations have been completed for the three coil configurations. The load in these simulations is cylindrical, 7 inches in diameter, 10 inches long, and located off-center such that the upper end of the cylinder in 1 inch below the upper termination of the microstrips 210. The load dielectric constant was $\epsilon_r=40-40j$. Tissues typically have higher dielectric constants but the head contains a lot of air and the dielectrics are inhomogeneous. This lower dielectric constant was chosen to allow a homogeneous cylinder to closer approximate the average loading of a human head. The capacitor values used in the simulations are listed in Table 2. The capacitors attached to longer length strips were set to the same values, while the capacitors in the shorter strips (due to the opening 250) were set to higher values, as set forth in Table 2. However, the hybrid configuration (coil 400) of FIGS. 4a and 4b necessitated different capacitive in the to-shield and the to-end-ring strip terminations, which is also set forth in Table 2. The dimensions of the simulated microstrip coil and the end-capped version are the same as those of the embodiment detailed in Table 1. The hybrid version has the same basic dimensions, except that the shield is extended 4 inches at the upper end, and the end ring is 1.5 inches wide.

TABLE 2

Capacitor values and quality factors of the simulated coils at 128 MHz

| Coil type | Lower end long microstrip | Lower end short microstrip | Upper end long microstrip | Upper end short microstrip | Quality factor (loaded) |
| --- | --- | --- | --- | --- | --- |
| Microstrip (FIGS. 2a and 2b) | 37.5 pF | 54.8 pF | 37.5 pF | 54.8 pF | 88 |
| Microstrip with end cap (FIGS. 3a and 3b) | 38.6 pF | 57.5 pF | 38.6 pF | 57.5 pF | 59 |
| Hybrid coil (FIGS. 4a and 4b) | 23.8 pF | 28.1 pF | 11.9 pF | 14.0 pF | 56 |

Figure 6A:
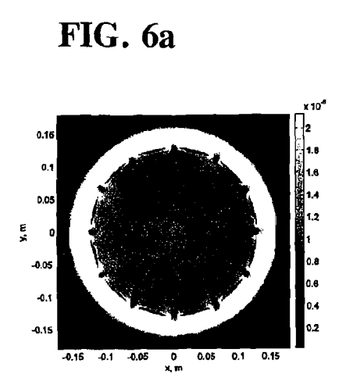
FIG. 6a is a schematic view of a simulated $B_1$ field pattern for the microstrip coil of FIGS. 3a and 3b along the axial plane z=0.
Figure 6B:
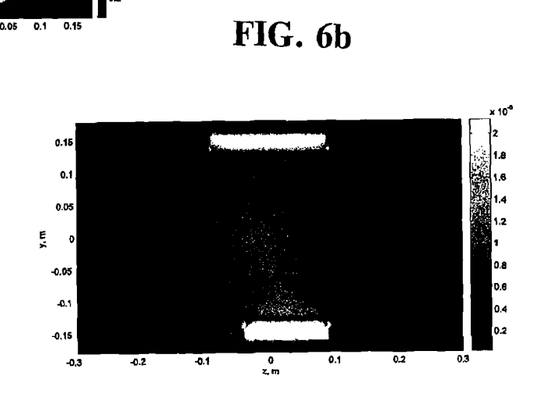
FIG. 6b is a schematic view of a simulated $B_1$ field pattern for the microstrip coil of FIGS. 3a and 3b along the mid-sagittal plane.
Figure 7A:
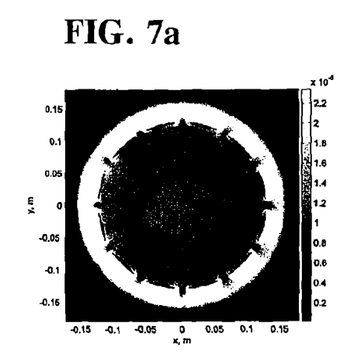
FIG. 7a is a schematic view of a simulated $B_1$ field pattern for the microstrip coil of FIGS. 4a and 4b along the axial plane z=0.
Figure 7B:
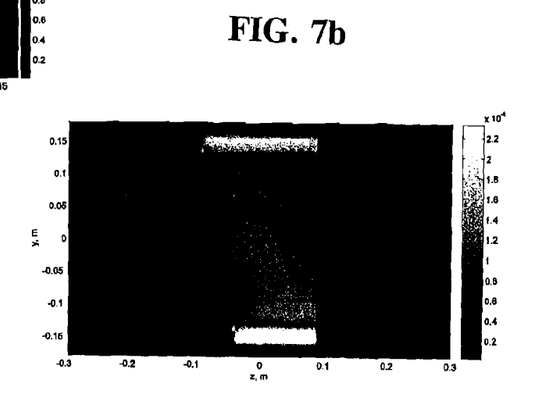
FIG. 7b is a schematic view of a simulated $B_1$ field pattern for the microstrip coil of FIGS. 4a and 4b along the mid-sagittal plane.
Figure 8A:
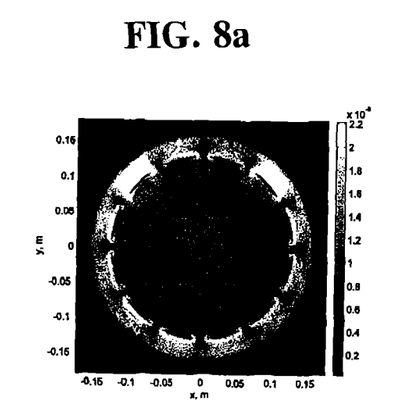
FIG. 8a is a schematic view of a simulated $B_1$ field pattern for the microstrip coil of FIGS. 5a and 5b along the axial plane z=0.
Figure 8B:
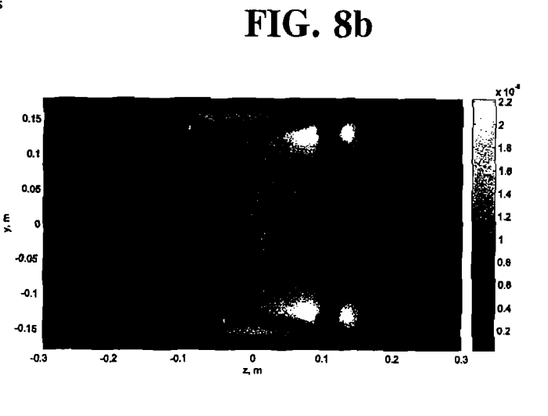
FIG. 8b is a schematic view of a simulated $B_1$ field pattern for the microstrip coil of FIGS. 5a and 5b along the mid-sagittal plane.

FIGS. 6-8 set forth the simulated $B_1$ field patterns for the microstrip (FIGS. 3a and 3b), end capped design (FIGS. 4a and 4b) and hybrid design (FIGS. 5a and 5b) respectively, which all include the opening feature. In each case, the $B_1$ field is in Tesla and the coil is driven with a 1 Watt source.

Figure 9A:
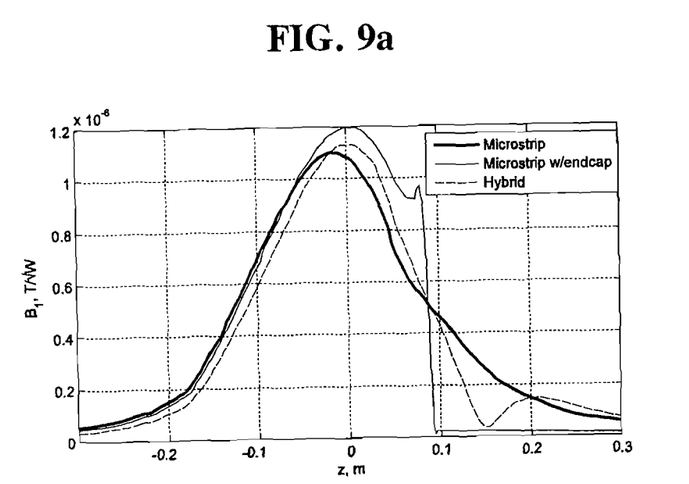
FIG. 9a is a plot of the simulated $B_1$ field patterns for the three coil designs of FIGS. 3a-5b along the z-axis.
Figure 9B:
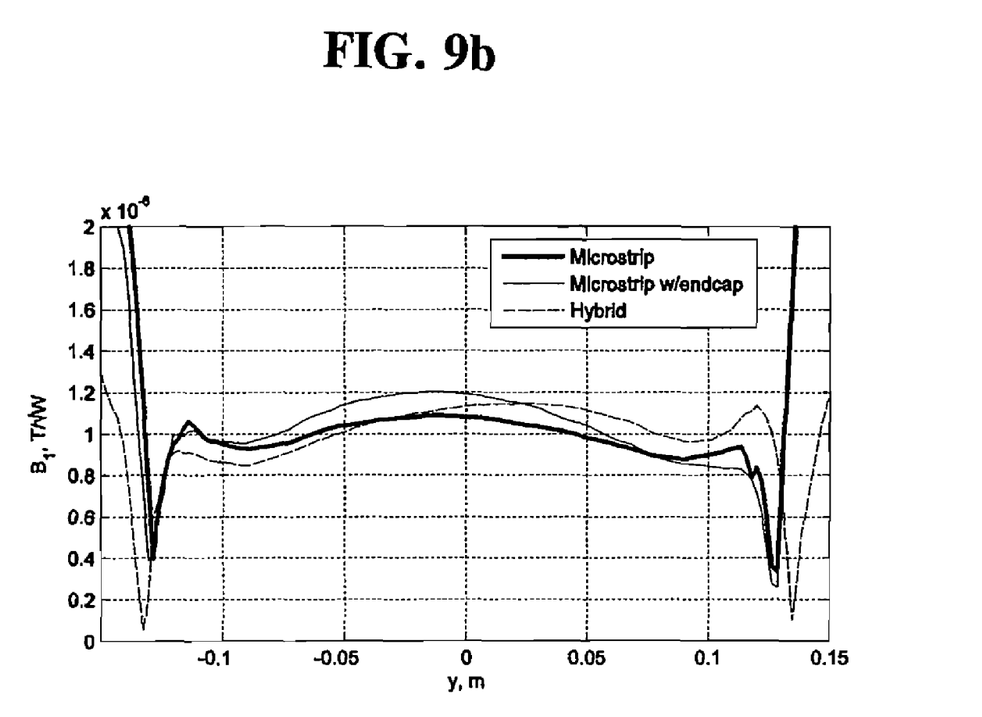
FIG. 9b is a plot of the simulated $B_1$ field patterns for the three coil designs of FIGS. 3a-5b along the y-axis.

FIG. 9 permits a more direct comparison between the $B_1$ patterns by plotting them on the same axes. FIG. 9 provides a comparison of the simulated $B_1$ field magnitude in the three coils designs, as measured along the z-axis and along the y-axis.

Example 2

According to each of the embodiments of the present invention, the coil is significantly shortened to reduce the field of view to the minimum necessary for brain imaging. This improves signal-to-noise ratio for brain imaging. In one embodiment, the coil has the following dimensions which are merely exemplary of the present invention and not limiting:

| | |
|---|---|
| Inner diameter of coil: | 10.25 in |
| Shield diameter of coil: | 12.5 in |
| Strip (microstrip) length: | 7.0 in |
| No. of strips: | 12 |
| Cutout (opening) depth: | 2.0 in |

For the hybrid coil 400, the shield is extended by about 4 in and the end ring is about 1.5 in wide. However and once again, the above dimensions are merely exemplary and it will be appreciated that a coil according to the present invention can have different dimensions than the ones above.

It will also be understood that the coil can include more than one of the above described openings. In other words, more than one cut out can be formed in the coil.

While the invention has been particularly shown and described with reference to preferred embodiments thereof, it will be understood by those skilled in the art that various changes in form and details can be made without departing from the spirit and scope of the invention.

What is claimed:

1. A microstrip-based RF coil for use in an MRI apparatus constructed to perform human head and extremity imaging, comprising: a shield support member having an outer surface and an interior, the outer surface supporting a conductive segmented shield; an inner core module disposed within the interior of the shield support member and having an inner surface and a longitudinal axis and a bore extending through the inner core module along the longitudinal axis and defining the inner surface; a plurality of conductive strip lines disposed on the inner surface of the inner core module and extending parallel to the longitudinal axis; a plurality of components that electrically couple and operatively connect the conductive strip lines to the segmented shield; and an opening formed at one end of the coil and defined by a slot formed in the shield support member and in the inner core module for placement over eyes of a patient, the opening causing the coil to have an asymmetrical design.

2. The microstrip-based RF coil of claim 1, wherein the plurality of strip lines includes at least one reduced length strip line and the segmented shield includes at least one reduced length shield segment, both of which are located in the region of the opening so as to permit formation of the slot.

3. The microstrip-based RF coil of claim 2, wherein there are two or more strip lines of reduced length and two or more reduced length shield segments that overlie the reduced length strip lines so as to form the slot.

4. The microstrip-based RF coil of claim 1, wherein the opening comprises a rectangular shaped slot formed along an arc at the one end of the coil so as reduce the overall length of the coil in a region of the opening.

5. The microstrip-based RF coil of claim 1, wherein the plurality of components include a plurality of tuning capacitors that electrically connect the strip lines to the segmented shield.

6. The microstrip-based RF coil of claim 1, wherein the conductive strips are adhesively attached to the inner surface of the core module with longitudinal spaces being formed between adjacent conductive strips.

7. The microstrip-based RF coil of claim 1, wherein each of the shield support member and the inner core module has a cylindrical shape, with the shield support member being concentric to and surrounding an outer surface of the inner core module.

8. The microstrip-based RF coil of claim 1, further including: a front end plate; and a rear end plate, wherein one end of the shield support member is attached to the front end plate and another end of the shield support cylinder is attached to the rear end plate with an annular space formed between the core module and inner surface of the shield support cylinder.

9. The microstrip-based RF coil of claim 1, wherein ends of the segmented shield are bent at right angles to define the ends of the coil and the plurality of components includes a plurality of shield interconnection capacitors that are formed in lines between shield segments.

10. The microstrip-based RF coil of claim 1, wherein an inner diameter of the coil is equal to or less than about 10.25 inches and a length of the micro line is equal to or less than about 7 inches and a depth of the opening is at least about 2 inches.

11. The microstrip-based RF coil of claim 1, wherein there are 12 or more striplines disposed on the inner surface of the inner core module and a diameter of the segmented shield is about 12.5 inches or less.

12. The microstrip-based RF coil of claim 1, further including a shield end cap disposed at the other end of the coil opposite the opening and electrically connected to the segmented shield, with the strip lines terminated to the shield end cap through tuning capacitors.

13. The microstrip-based RF coil of claim 1, wherein the end cap closes the other end of the coil and is in the form of a slotted conductive element with shield interconnection capacitors extending along and between the shield segments and then between the slotted end cap.

14. A hybrid microstrip-based RF coil for use in an MRI apparatus constructed to perform human head and extremity imaging, comprising: a shield support member having an outer surface and an interior, the outer surface supporting a conductive segmented shield; an inner core module disposed within the interior of the shield support member and having an inner surface and a longitudinal axis and a bore extending through the inner core module along the longitudinal axis and defining the inner surface; a plurality of conductive strip lines disposed on the inner surface of the inner core module and extending parallel to the longitudinal axis, wherein a first end of the coil has a transversal electromagnetic (TEM) resonator structure, with ends of the strips lines that face the first end being electrically connected to the segmented shield by means of first electrical components; and a conductive end ring disposed at an opposite second end of the coil, with the strip lines being terminated through and electrically connected to the conductive ring by means of second electrical components, the first end of the coil being free of a conductive ring.

15. The hybrid microstrip-based RF coil of claim 14, wherein the first electrical components comprise tuning capacitors and the second electrical components comprise tuning capacitors that are disposed between ends of the strip lines and the end ring.

16. The hybrid microstrip-based RF coil of claim 14, wherein the end ring is free of an electrical connection to the segmented shield.

17. The hybrid microstrip-based RF coil of claim 14, further including a opening formed at the second end of the coil and defined by a slot formed in the outer support member and in the inner core module for placement over eyes, or other body part that requires unobstructed space, of a patient, the opening causing the coil to have an asymmetrical design due in part to the strip lines being of different lengths.

18. The hybrid microstrip-based RF coil of claim 17, wherein the plurality of strip lines includes at least one reduced length strip line and the segmented shield includes at least one reduced length shield segment, both of which are located in the region of the opening so as to permit formation of the slot.

19. The hybrid microstrip-based RF coil of claim 18, wherein there are two or more strip lines of reduced length and two or more reduced length shield segments that overlie the reduced length strip lines so as to form the slot.

20. The hybrid microstrip-based RF coil of claim 17, wherein the opening comprises a rectangular shaped slot formed at the one end of and along an arc of the coil so as reduce the overall length of the coil in a region of the opening.

21. The hybrid microstrip-based RF coil of claim 14, wherein each of the shield support member and the inner core module has a cylindrical shape, with the shield support member being concentric to and surrounding an outer surface of the inner core module.

22. The hybrid microstrip-based RF coil of claim 14, wherein an inner diameter of the coil is equal to or less than about 10.25 inches and a length of the micro line is equal to or less than about 7 inches and a depth of the opening is at least about 2 inches and a diameter of the shield is about 16.5 inches or less and a width of the end ring is at least about 1.5 inches.

23. A microstrip-based RF coil for use in an MRI apparatus constructed to perform human head and extremity imaging, comprising: a coil former defined by an inner core member and a shield support that surrounds the inner core member, with an outer surface of the shield support supporting a conductive segmented shield and a plurality of conductive strip lines disposed on an inner surface of the inner core module and extending parallel to a longitudinal axis thereof, the strip lines being electrically connected to the segmented shield, and wherein all of the strip lines are not homogeneous so as to introduce asymmetry into the coil design.

24. The microstrip-based RF coil, claim 23, further including: a plurality of components that electrically couple and operatively connect the conductive strip lines to the segmented shield; and an opening formed at one end of the coil and defined by a slot formed in the shield support member and in the inner core module for placement over eyes, or other body part that requires unobstructed space, of a patient, the opening causing the strip lines to have the asymmetrical design.

25. The microstrip-based RF coil of claim 23, wherein the plurality of strip lines includes at least one reduced length strip line and the segmented shield includes at least one reduced length shield segment, both of which are located in the region of the opening so as to permit formation of the slot.

26. The microstrip-based RF coil of claim 25, wherein there are two or more strip lines of reduced length and two or more reduced length shield segments that overlie the reduced length strip lines so as to form the slot.

27. The microstrip-based RF coil of claim 23, wherein the opening comprises a rectangular shaped slot formed at the one end of the coil so as reduce the overall length of the coil in a region of the opening.

28. The microstrip-based RF coil of claim 23, wherein the plurality of components include a plurality of tuning capacitors that electrically connect the strip lines to the segmented shield.

29. A microstrip-based RF coil for use in an MRI apparatus constructed to perform human head and extremity imaging, comprising: a coil former defined by an inner core member and a shield support that surrounds the inner core member, with an outer surface of the shield support supporting a conductive segmented shield and a plurality of conductive strip lines disposed on an inner surface of the inner core module and extending parallel to a longitudinal axis thereof, wherein the conductive strip lines include at least one first strip line that is shorter in length than a plurality of second strip lines, the first and second strip lines being electrically connected to the segmented shield by means of tuning capacitors, with a tuning capacitor associated with each first strip line having a capacitor value that is different from a value of a tuning capacitor that is associated with one second strip line.

30. The microstrip-based RF coil of claim 29, wherein the capacitor associated with the first strip line, that has a shorter length compared to each of the second strip lines, has a greater value than the value of the capacitors associated with the second strip lines.

* * * * *